United States Patent [19]
Jagger et al.

[11] Patent Number: 5,471,135
[45] Date of Patent: Nov. 28, 1995

[54] TESTER AND METHOD FOR TESTING A RECTIFIER-REGULATOR

[76] Inventors: Eric Jagger, 111 Bean Creek Rd. #144, Scotts Valley, Calif. 95066; Hyung Paek, 2645 California St. #305, Mountain View, Calif. 94040

[21] Appl. No.: 325,970

[22] Filed: Oct. 20, 1994

[51] Int. Cl.$^6$ ................................................. G01R 31/00
[52] U.S. Cl. ........................ 324/158.1; 324/772; 324/771; 324/767
[58] Field of Search ................................. 324/158.1, 772, 324/771, 767

[56] References Cited

PUBLICATIONS

Honda CB750K Owners Manual, "Battery/Charging System", p. 228, data unknown.

*Primary Examiner*—Kenneth A. Wieder
*Assistant Examiner*—Kourosh Cyrus Khosravi
*Attorney, Agent, or Firm*—Flehr, Hohbach, Test, Albritton & Herbert

[57] ABSTRACT

A tester and method for testing a rectifier-regulator. A ramping voltage generator generates a ramping input voltage during each of a multiplicity of ramping cycles in response to ramping voltage control signals provided by a controller. A relay circuit relays the ramping input voltage to one of the input terminals of the rectifier-regulator during each ramping cycle in response to relay control signals provided by the controller. The rectifier-regulator provides in response a ramping output voltage at its output terminal during each of the ramping cycles. A voltage measurement circuit makes voltage measurements during each of the ramping cycles representing the ramping output voltage. A trip point determination circuit determines when the trip point of the rectifier-regulator occurs during each of the ramping cycles and generates in response a trip point signal during each of the ramping cycles indicating that the trip point has occurred. A memory stores a predefined maximum trip point voltage and a predefined minimum trip point voltage. The controller estimates the trip point voltage for each ramping cycle in response to the trip point signal and the voltage measurements. It then compares the estimated trip point voltage for each of the ramping cycles with the stored predefined maximum and minimum voltages and generates a trip point error flag indicating that a trip point error has occurred for each of the ramping cycles where the compared trip point voltage does not fall within a range between the stored predefined maximum and minimum voltages.

12 Claims, 12 Drawing Sheets

TESTER AND METHOD FOR TESTING A RECTIFIER-REGULATOR

The present invention relates to testers and methods for testing the rectifier-regulator of the battery charging system of a motorized vehicle. In particular, it relates to testers and methods for testing the rectifier-regulator of the battery charging system of a motorcycle.

BACKGROUND OF THE INVENTION

The typical charging system of a motorcycle includes a multi-phase alternator and a rectifier-regulator. The alternator produces multiple ac input currents that are rectified into a single dc current by the rectifier-regulator which flows through the battery so as to charge it. When the battery is charged to a specific (trip point) voltage, a trip point occurs and the rectifier-regulator regulates the amount of the dc current flowing in the battery.

In the past, rectifier-regulators have been tested using non-automated manual testing apparatuses and methods. In one method, the user tests the performance of the rectifier-regulator with the engine of the motorcycle running. This is done by connecting a voltmeter across the battery of the motorcycle and manually observing whether the voltage across the battery gradually rises and then peaks at about 14–15 volts when the trip point occurs. This method however suffers from several problems.

First, the rectifier-regulator includes multiple diode combinations for rectifying the multiple input currents of the multi-phase alternator. Thus, while some of the diode combinations may be defective, the user may still observe a peak voltage around 14–15 volts if at least one of the diode combinations is working properly. As a result, the user is unable to determine whether all of the diode combinations are working properly.

Second, as was indicated earlier, the rectifier-regulator is connected to the battery and the alternator during the test. As a result, if the voltage across the battery does not peak at 14–15 volts, this may be due to a defective battery or alternator rather than a defective rectifier-regulator.

In another method, two 12 volt batteries connected in series are manually connected to one diode combination of the rectifier-regulator at a time. Across the series connection of the 12 volt batteries is manually connected a variable resistor and a volt meter. A lamp is manually connected across the output of the rectifier-regulator. The user varies the variable resistor and observes the lamp to determine when the lamp goes out. When the lamp does go out, this means that the trip point has occurred and the user then observes the volt meter to determine whether the trip point occurred at around 14–15 volts. Like the earlier method described, this method also suffers from a number of problems.

First, the components used for this method are rather bulky and must be manually connected. Moreover, during testing, the connection of the 12 volt batteries to the diode combinations must be manually made one at a time. As a result, the set up of the test and the actual test itself are time consuming.

Second, the user must estimate the trip point voltage by watching the lamp and then quickly reading the volt meter. Thus, the accuracy of the test depends on the reactions and senses of the user.

SUMMARY OF THE INVENTION

The forgoing problems are solved by a tester and method for testing a rectifier-regulator. The tester includes a ramping voltage generator, a relay circuit, a trip point determination circuit, a voltage measurer, a memory, and a controller.

The controller generates ramping control signals. The ramping voltage generator generates a ramping input voltage during each of a multiplicity of ramping cycles in response to the ramping voltage control signals.

The controller also generates relay control signals. The relay circuit relays the ramping input voltage to one of the input terminals of the rectifier-regulator during each ramping cycle in response to the relay control signals. The rectifier-regulator provides in response a ramping output voltage at its output terminal during each of the ramping cycles.

The voltage measurement circuit makes voltage measurements during each of the ramping cycles representing the ramping output voltage.

The trip point determination circuit determines when the trip point of the rectifier-regulator occurs during each of the ramping cycles and generates in response a trip point signal during each of the ramping cycles indicating that the trip point has occurred.

The memory stores a predefined maximum trip point voltage and a predefined minimum trip point voltage.

The controller estimates the trip point voltage for each ramping cycle in response to the trip point signal and the voltage measurements. It then compares the estimated trip point voltage for each of the ramping cycles with the stored predefined maximum and minimum voltages and generates a trip point error flag indicating that a trip point error has occurred for each of the ramping cycles where the compared trip point voltage does not fall within a range between the stored predefined maximum and minimum voltages.

BRIEF DESCRIPTION OF THE DRAWINGS

Additional objects and features of the invention will be more readily apparent from the following detailed description and appended claims when taken in conjunction with the drawings, in which:

FIG. 9a is a block diagram of the trip point determination circuit used to determine the trip point of the rectifier-regulator of FIG. 2a.

DETAILED DESCRIPTION OF THE INVENTION

Figure 1A:
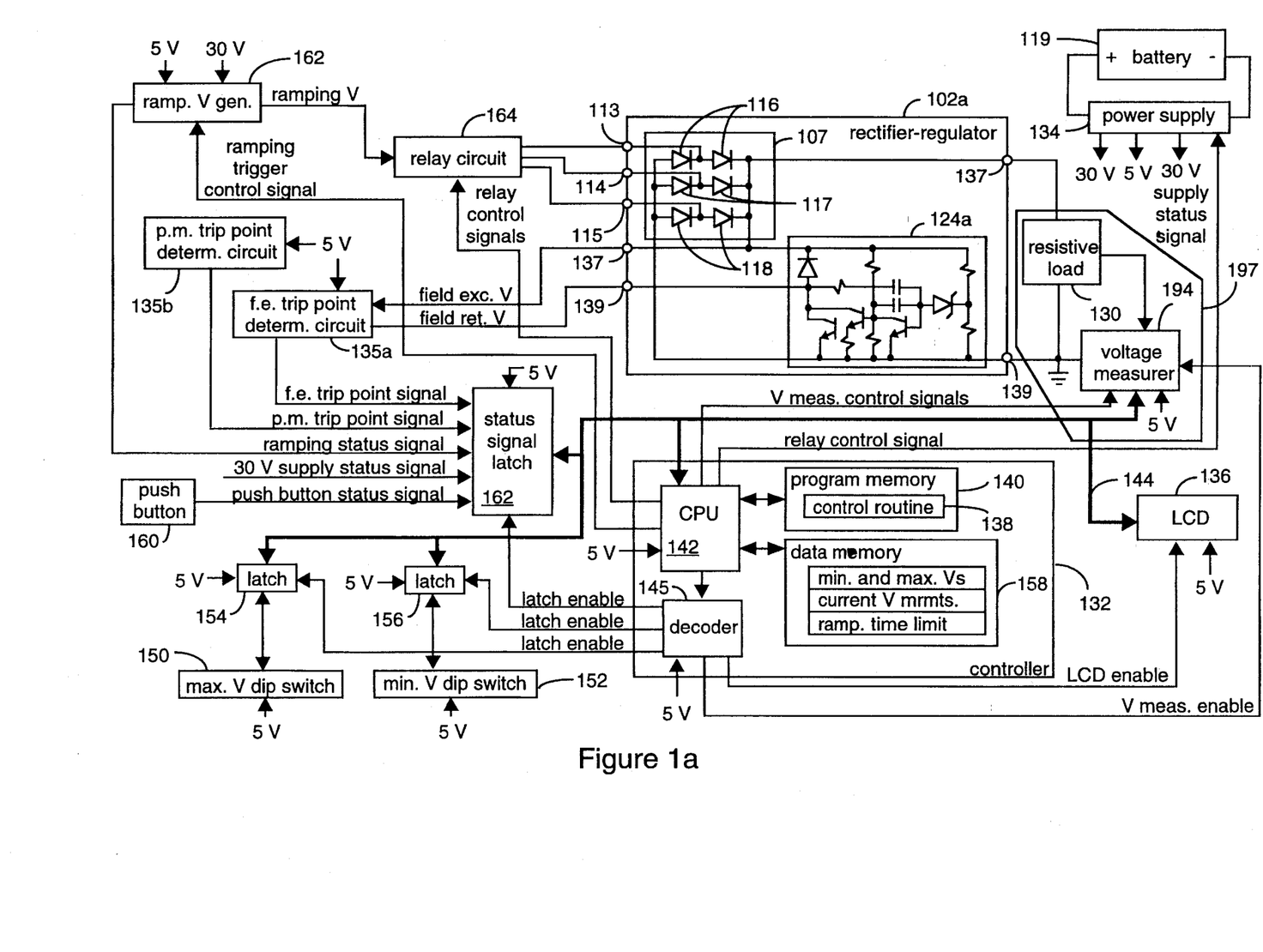
FIGS. 1a and 1b are block diagrams of a rectifier-regulator tester in accordance with the present invention.
Figure 1B:
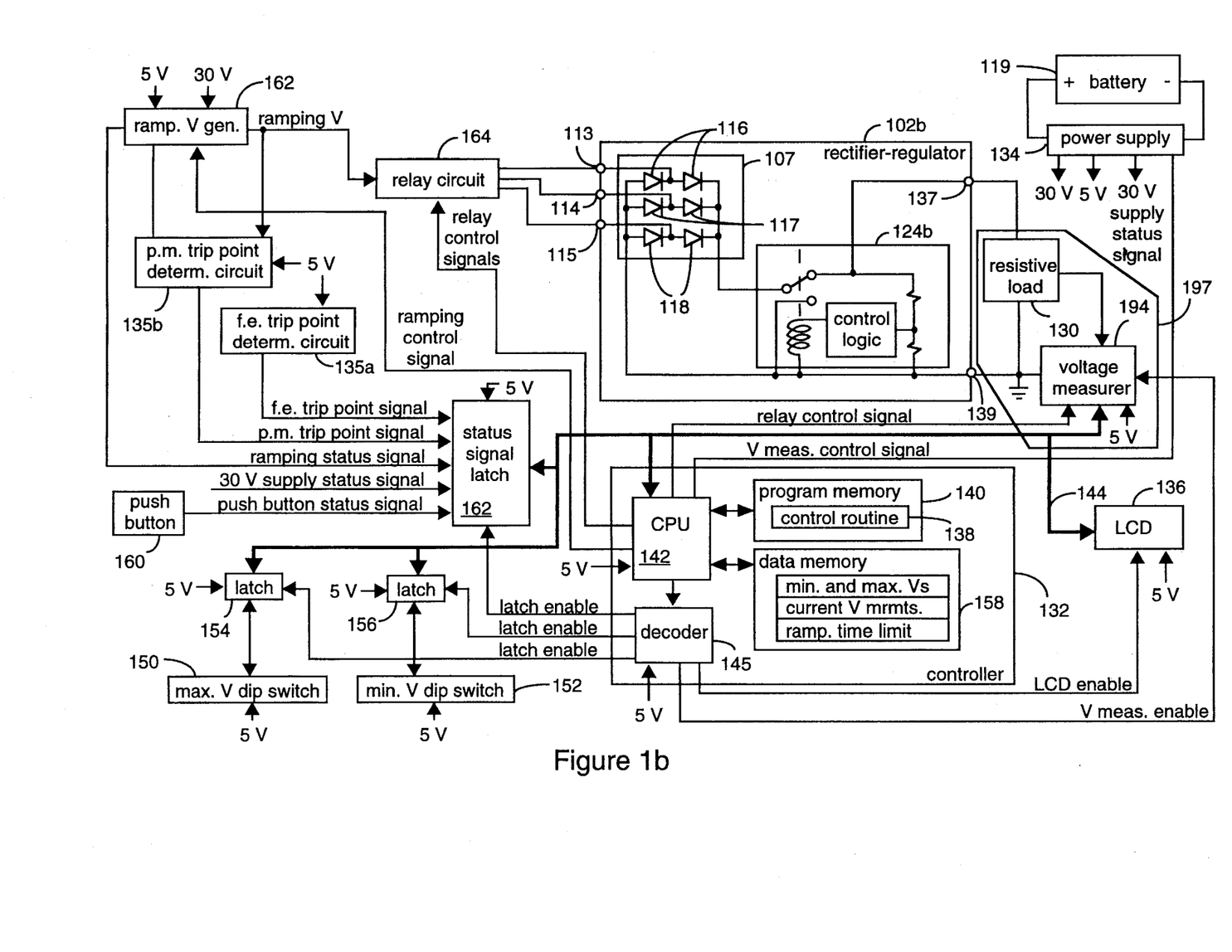

Referring to FIGS. 1a and 1b, there is shown a rectifier-regulator tester 100 which is capable of testing both of the rectifier-regulators 102a and 102b.

Normal Operation of Rectifier-Regulator

Figure 2A:
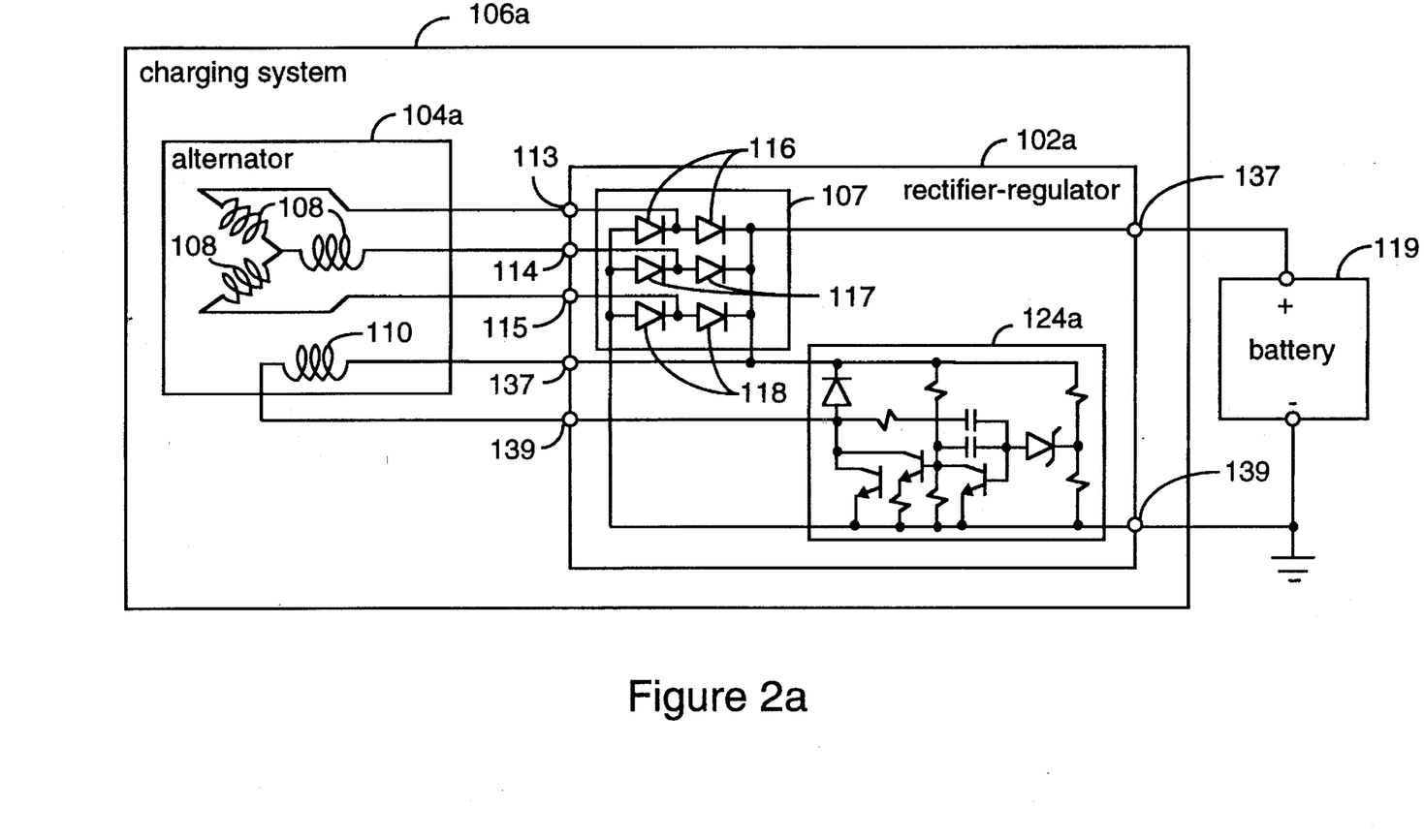
FIG. 2a is a block diagram of a battery charging system that employs a field excited alternator.

FIG. 2a shows the rectifier-regulator 102a as used in normal operation in a battery charging system 106a of a motorcycle that employs a field excited multiple-phase alternator 104a. The coils 108 in conjunction with the field coil 110 produce multiple ac currents with different phases.

Figure 2B:
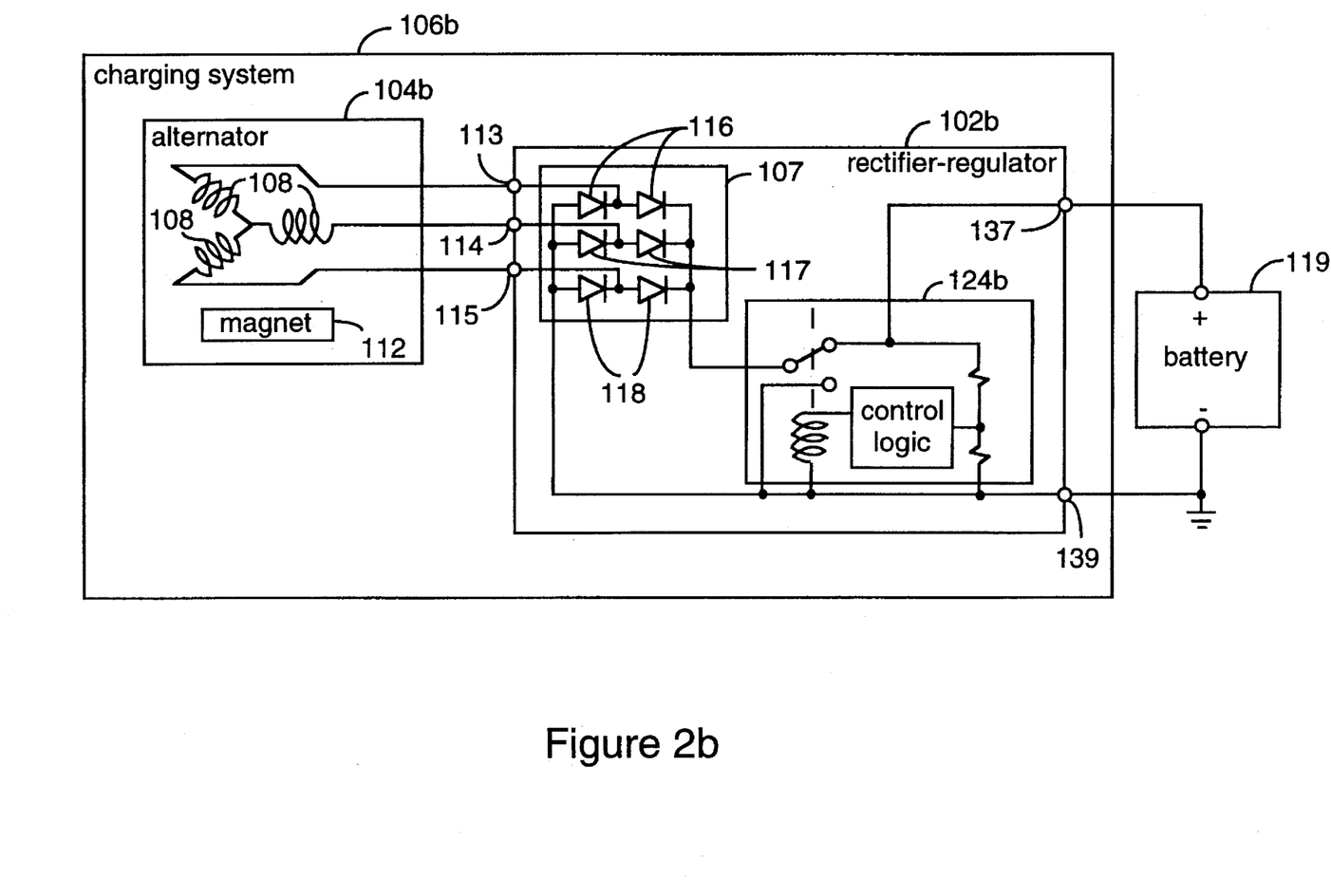
FIG. 2b is a block diagram of a battery charging system that employs a permanent magnet alternator.

FIG. 2b shows the rectifier-regulator 102b as used in normal operation in a battery charging system 106b that employs a permanent magnet multi-phase alternator 104a. In this case, the coils 108 in conjunction with the permanent magnet 112 produce the multiple ac currents with different phases.

Both of the rectifier-regulators 102a and 102b of FIGS. 2a and 2b include multiple input terminals 113–115 for receiving during normal operation the corresponding multiple ac input currents. Moreover, the rectifier circuit 107 of both of the rectifier-regulators 102a and 102b includes multiple diode combinations 116–118 which rectify the corresponding ac input currents to produce a single dc current that flows in the battery 119 between the output and return terminals 120 and 122. The dc current charges the battery 119.

When the battery is charged to a specific (trip point) voltage, a trip point occurs and the regulator circuit 124a or 124b of the rectifier-regulator 102 regulates the amount of the dc current flowing in the battery 119. Referring to FIG. 2a, in the case of the rectifier-regulator 102a, the regulator circuit 124a cuts off the current through the field coil 110. As a result, the alternator 104a no longer produces current which reaches the battery 119. Referring to FIG. 2b, in the case of the rectifier-regulator 102b, the regulator circuit 124b shunts the current that would normally go to the battery 119.

Testing of Rectifier-Regulator

Referring back to FIGS. 1a and 1b, during testing of the rectifier-regulator 102 with tester 100, the input terminals 113–115 of the rectifier-regulators 102a and 102b are disconnected from the alternators 104a and 104b and instead respectively connected to the output terminals 125–127 of the relay circuit 128. Moreover, the output and return terminals 120 and 122 of the rectifier-regulator 102 are disconnected from the battery 119 and are instead connected across the resistive load 130.

Referring to FIG. 1a, when testing the regulator-rectifier 102a used with the field exciting alternator 104a, the trip point determination circuit 135a is connected across the field exciting output terminal 137 and the field return input terminal 139 of the regulator-rectifier 102a. The trip point determination circuit 135b however is left uncoupled.

On the other hand, referring to FIG. 1b, when testing the regulator-rectifier 102b used with the permanent magnet alternator 104b, the trip point determination circuit 135b is connected to the ramping voltage generator 162. In this case, the trip point determination circuit 135a is left uncoupled.

Moreover, the battery 119 is instead connected to the power supply 134. In response, the power supply 134 produces a 5 volt supply voltage provided to the various components of the tester 100.

Figure 3:
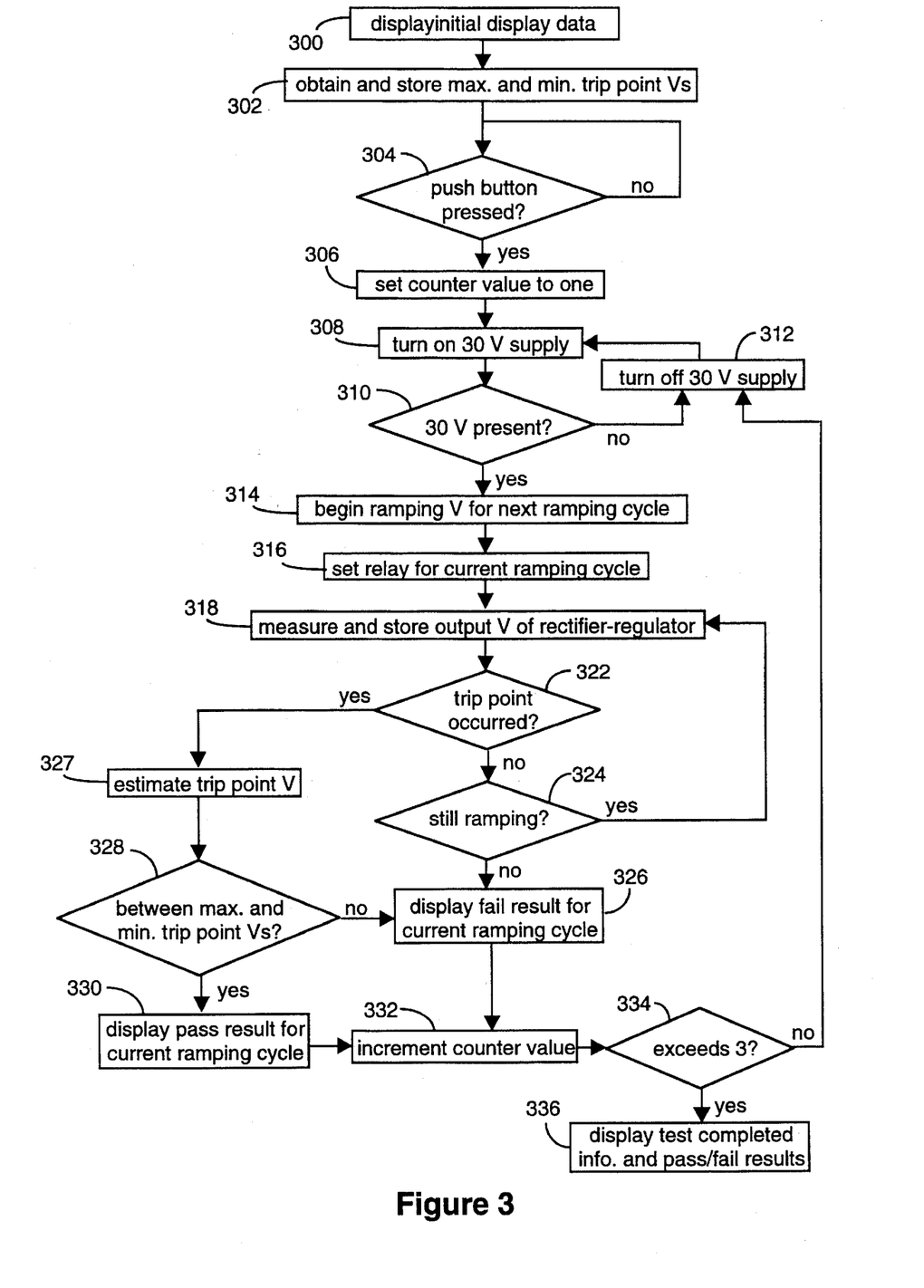
FIG. 3 shows the flow of operation of the tester of FIGS. 1a and 1b.

Referring to FIGS. 1a, 1b, and 3, on power up of the tester 100, the control routine 138 of the controller 132 generates initial display data. The control routine 138 is stored in the program memory 140 and run on the central processing unit (CPU) 142. The initial display data is provided by the CPU 142 over the main data bus 144.

At the same time, the control routine 138 generates control signals outputted by the CPU 142 and decoded by decoder 145 to produce an LCD enable signal for enabling the LCD 136 to receive the initial display data from the main data bus 144. In response, the LCD 136 displays the initial display data (block 300 of FIG. 3).

The tester 100 then obtains the maximum and minimum trip point voltages selected and inputted by the user (block 302 of FIG. 3), This is done when the user selects the maximum and minimum trip point voltages with the maximum and minimum limit dip switches 150 and 152, respectively.

The control routine 138 successively generates control signals outputted by the CPU 142 and decoded by the decoder 145 to produce successive maximum and minimum limit latch enable signals for successively enabling the maximum and minimum limit latches 154 and 156 to latch the maximum and minimum trip point voltages onto the main data bus 144. The control routine 138 then successively stores the latched maximum and minimum trip voltages in the data memory 158.

Then, the tester 100 determines when the user has pressed the push button 160 to begin the test of the rectifier-regulator 102a or 102b (decision block 304 of FIG. 3). When the user presses down on the push button 160, it sends a push button status signal indicating that this has occurred to the status latch 162. The control routine 138 periodically generates control signals outputted by the CPU 142 and decoded by the decoder 145 to produce a status latch enable signal. The status latch enable signal enables the status latch 162 to latch the status signals, including the push button status signal, onto the main data bus 144. In response, the control routine 138 determines from the push button status signal received by the CPU 142 whether the push button 160 was pressed. When control routine 138 determines that the push button status signal does not indicate that the push button 160 was pressed, then this process (decision block 304 of FIG. 3) is repeated until it does determine that the push button 160 was pressed.

Once control routine 138 does determine that the push button was pressed, it initializes its own programmed internal counter by setting the initial counter value to one (block 306 of FIG. 3). As will be described in more detail later, the internal counter is then incremented by one after each of the three ramping cycles of the ramping voltage generator 162. The first, second, and third counter values respectively correspond to the first, second, and third ramping cycles, the first, second, and third input terminals 113–115, and the first, second, and third diode combinations 116–118.

Figure 4:
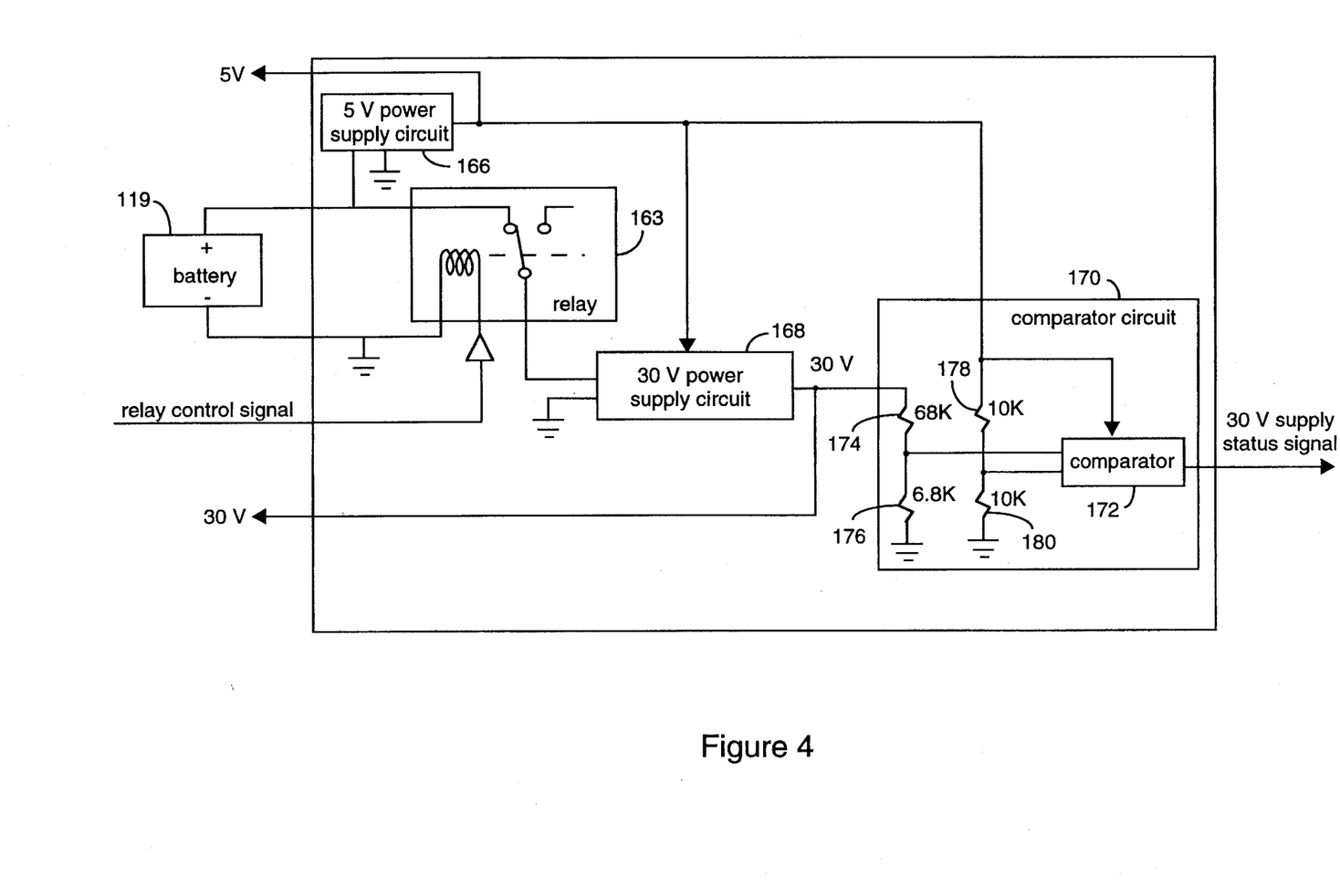
FIG. 4 is a block diagram of the power supply of the tester of FIGS. 1a and 1b.

The power supply 134 provides a 5 volt supply voltage to the various components of the tester 100. Referring to FIG. 4, the 5 volt power supply circuit produces the 5 volt supply voltage.

Turning again to FIGS. 1a and 1b, the power supply 134 also provides for each ramping cycle a 30 volt supply voltage to be used by the ramping voltage generator 162 for generating a ramping voltage during each ramping cycle. This is accomplished when the control routine 138 generates a power supply relay control signal outputted by the CPU 142 to the power supply 134. As shown in FIG. 4, the power supply 134 includes a relay 163 that in response to the power supply relay control signal relays the voltage of the battery 119 to the 30 volt power supply circuit 168. As a result, the 30 volt power supply circuit 168 is turned on and produces a 30 volt supply voltage (block 308 of FIG. 3).

Then, the tester 100 determines if the 30 volt supply voltage is actually present (decision block 310 of FIG. 3). Referring again to FIG. 4, this is accomplished when the 30 volt supply voltage is provided to the voltage comparator circuit 170 of the power supply 134. The comparator 172 of the comparator circuit 170 compares the divided 30 volt supply voltage from the voltage divider formed by the resistors 174 and 176 with the divided 5 volt supply voltage from the voltage divider formed by the resistors 178 and 180 to determine if there is a 30 volt supply voltage. In response, the comparator 172 outputs a 30 volt supply voltage status signal.

Turning again to FIGS. 1a, 1b, and 3, the 30 volt supply voltage status signal is provided to the status latch 162. The control routine 138 then generates control signals outputted by the CPU 142 and decoded by the decoder 145 to produce the status latch enable signal. In response, the status latch 162 latches the status signals, including the 30 volt supply voltage status signal, onto the main data bus 144. The control routine 138 determines from the 30 volt supply voltage status signal received by the CPU 142 whether the 30 volt supply voltage is present.

If control routine 138 determines that the 30 volt supply voltage status signal does not indicate that the 30 volt supply voltage is present, then the 30 volt power supply circuit 168 is turned off (block 312 of FIG. 3). This is done when control routine 138 stops generating the power supply relay control signal outputted by the CPU 142 to the power supply 134. As a result, the relay 163 of FIG. 4 stops relaying the voltage of the battery 119 to the 30 volt power supply circuit 168. Thus, the 30 volt power supply circuit 168 is turned off and stops producing the 30 volt supply voltage. After the 30 volt supply circuit 166 is turned off, the process of generating the 30 volt supply voltage (block 308 of FIG. 3) is repeated until control routine 138 does determine that the 30 volt supply voltage is present (decision block 310 of FIG. 3).

Referring again to FIGS. 1a, 1b, and 3, the ramping voltage generator 162 then begins producing a high level ramping voltage for the next ramping cycle corresponding to the current counter value (block 314 of FIG. 3). This is done when control routine 138 generates a ramping trigger control signal for each ramping cycle after it is determined by the control routine 138 that the 30 volt supply voltage is present. The ramping trigger control signal is outputted by the CPU 142 and provided to the trigger circuit 181 of the ramping voltage generator 162.

Figure 5:
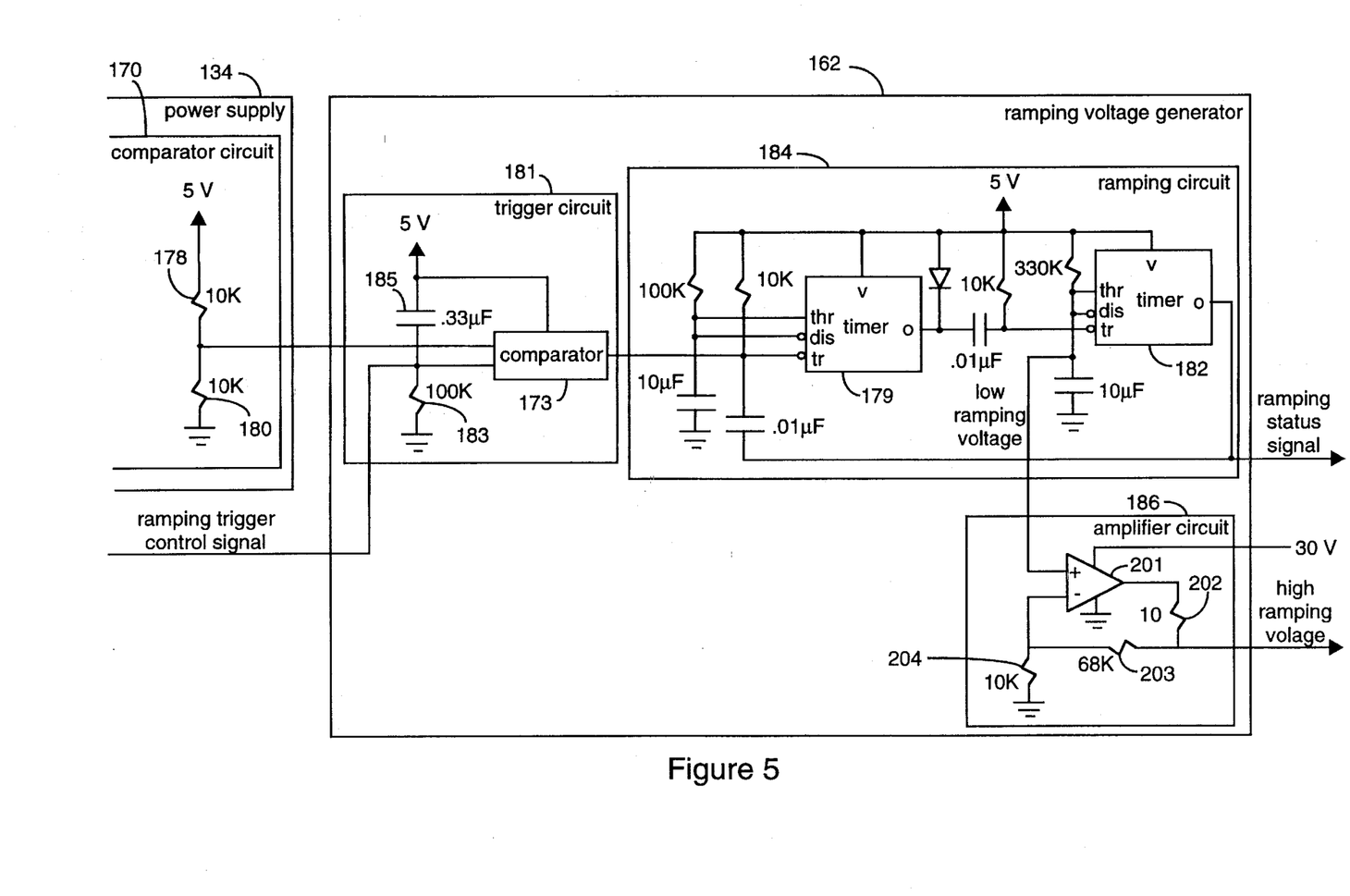
FIG. 5 is a block diagram of the ramping voltage generator of the tester of FIGS. 1a and 1b.
Figure 6:
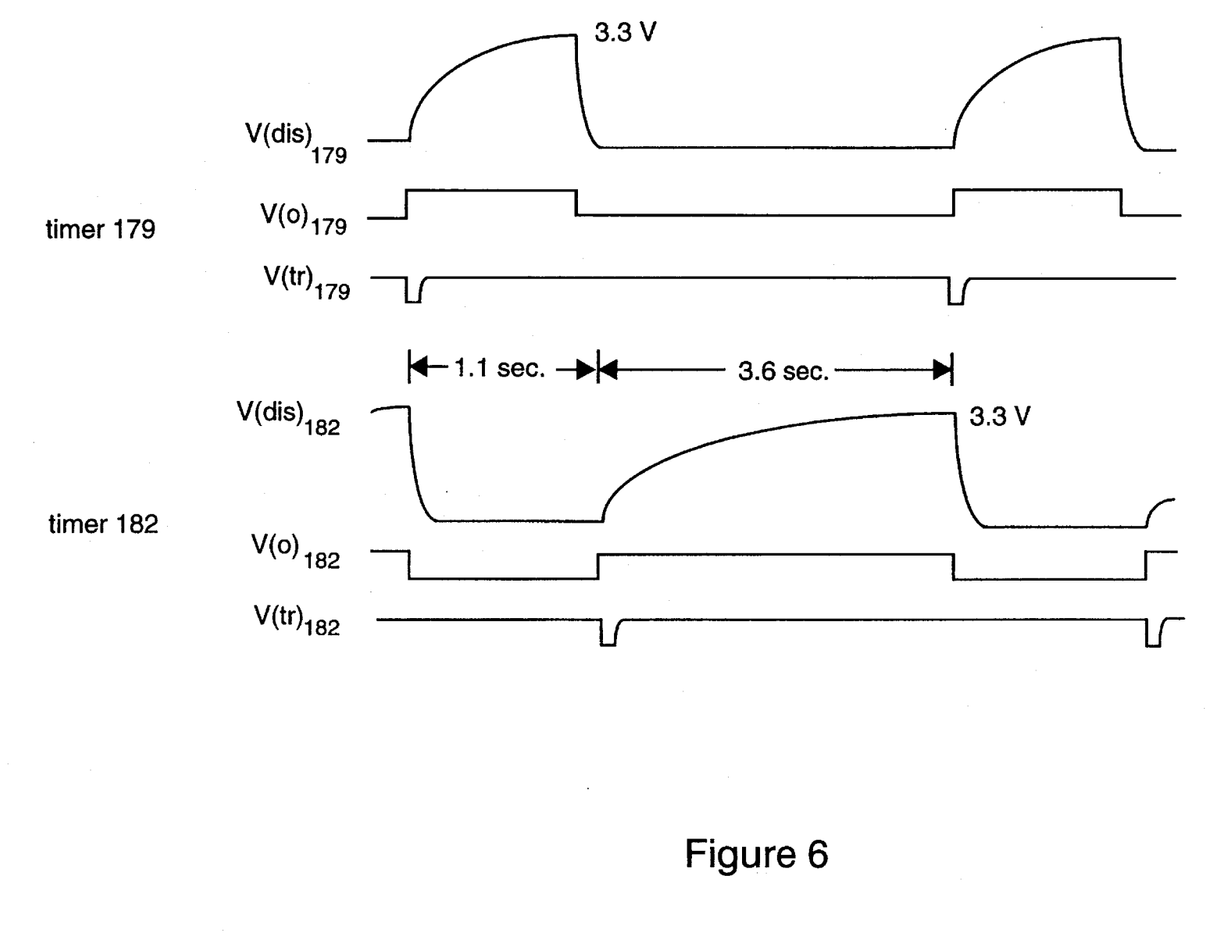
FIG. 6 shows a timing diagram of the ramping circuit of the ramping voltage generator of FIG. 5.

The ramping trigger control signal is used to initiate the next ramping cycle and, as shown in FIG. 5, is provided by the RC combination of the resistor 183 and the capacitor 185 to the comparator 173. In response, the comparator 173 compares the ramping trigger control signal to the divided 5 volt supply voltage from the voltage divider formed by the resistors 178 and 180 of the comparator circuit 170 of the power supply 134 to produce a ramping trigger signal $V(tr)_{179}$ as shown in FIG. 6. The comparators 172 and 173 may be included in an LM393 IC chip produced by National Semiconductor.

As shown in FIG. 5, the trigger input (tr) of the first timer 179 of the ramping circuit 184 receives the ramping trigger signal. In response, the discharge output (dis) of the second timer 182 of the ramping circuit produces a low level ramping voltage $V(dis)_{182}$ during each ramping cycle that rises from 0 to 3.3 volts in the 3.6 seconds of the ramping cycle, as shown in FIG. 6. The timers 179 and 182 may be NE555 timers produced by National Semiconductor.

Referring again to FIG. 5, the low level ramping voltage is then provided to the amplifier circuit 186. Since the 30 volt power supply circuit 168 is turned on at this point and provides the amplifier 201 with the 30 volt supply voltage, the amplifier 201 amplifies the low level ramping voltage and a high level ramping voltage is produced during each ramping cycle across the feedback resistors 203 and 204. The high level ramping voltage rises from 0 to 25.5 volts during the 3.6 seconds of the ramping cycle.

Moreover, at the beginning of each ramping cycle, the ramping status signal $V(o)_{182}$ provided by the output (o) of the second timer 182 indicates, as shown in FIG. 6, that a ramping cycle is occurring. Referring again to FIGS. 1a, 1b, and 3, the ramping status signal is provided to the status latch 162. The control routine 138 then generates control signals outputted by the CPU 142 and decoded by the decoder 145 to produce the status latch enable signal. In response, the status latch 162 latches the status signals, including the ramping status signal, onto the main data bus 144. The control routine 138 determines from the ramping status signal received by the CPU 142 that a ramping cycle has started.

Then, the relay circuit 164 is set so that the ramping voltage is relayed to the input terminal 113, 114, or 115 that corresponds to the current value of the counter of the control routine 138 (and corresponds to the current ramping cycle) (block 31 6 of FIG. 3). This is accomplished for each ramping cycle when control routine 138 generates relay control signals outputted by the CPU 142 for controlling the relay circuit 164 after it has determined that a ramping cycle has begun.

Figure 7:
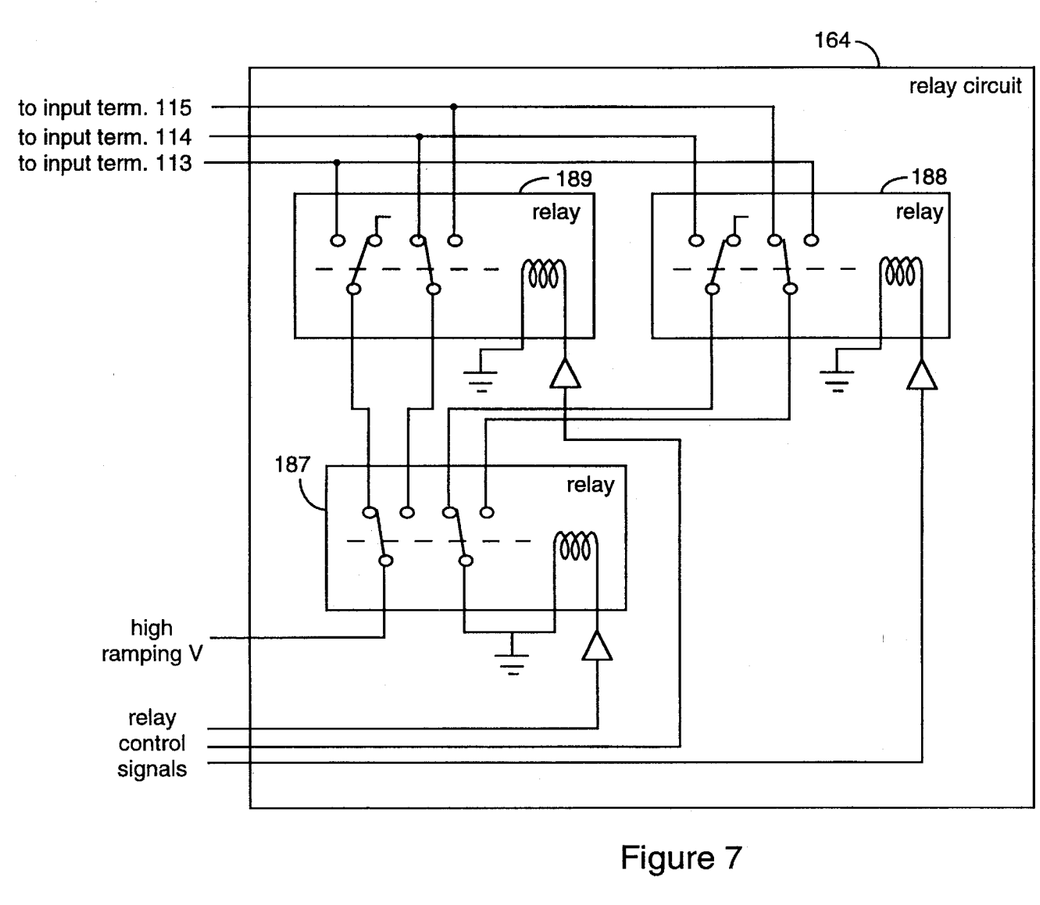
FIG. 7 is a block diagram of the relay circuit of the tester of FIGS. 1a and 1b.

Turning to FIG. 7, the relay control signals control the individual relays 187–189 during each of the ramping cycles. For example, during the first ramping cycle, these control signals direct the first and third relays 187 and 189 to relay the high level ramping voltage to the first input terminal 113 and direct the first and second relays 187 and 188 to relay a ground to the second input terminal 114. This combination of the first, second, and third relays 187–189 leaves the connection to third terminal 115 open. During the second ramping cycle, these control signals direct the first and second relays 187 and 188 to relay a ground to the third input terminal 115 and direct the first and third relays 187 and 189 to relay the high level ramping voltage to the second input terminal 114. This combination of the first, second, and third relays 187–189 leaves the connection to the first terminal 113 open. During the third ramping cycle, these control signals direct the first and third relays 187 and 189 to relay the high level ramping voltage to the third input terminal 115 and direct the first and second relays 187 and 188 to relay a ground to the first input terminal 113. This combination of the first, second, and third relays 187–189 leaves the connection to the second terminal 114 open.

Figure 8:
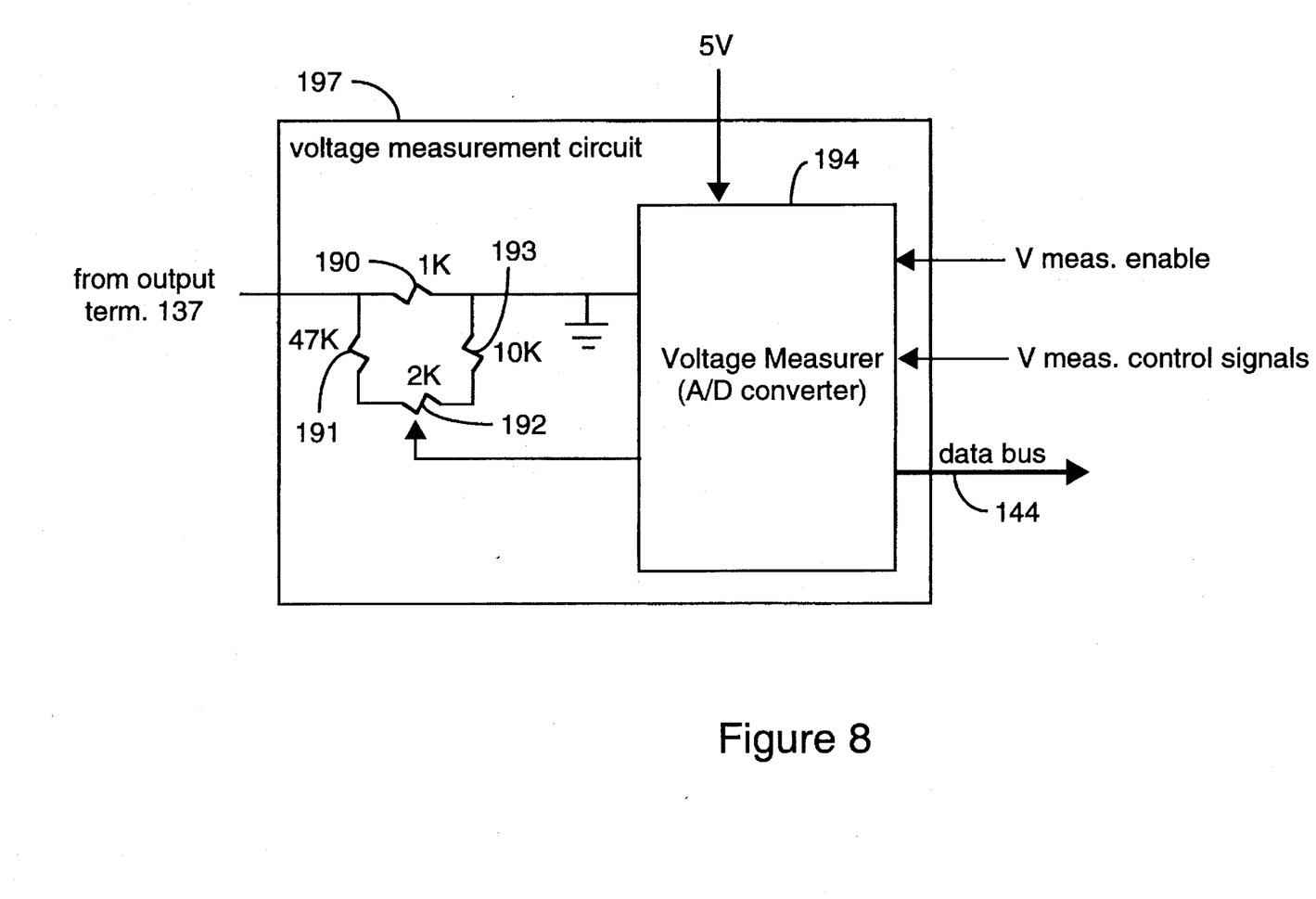
FIG. 8 is a block diagram of the voltage measurement circuit of the tester of FIGS. 1a and 1b.

Referring back to FIGS. 1a and 1b, in response to the high level ramping voltage during each ramping cycle, a current passes through the diode combination 116, 117, or 118 of the rectifier circuit 107 that corresponds to the current ramping cycle and passes through the resistive load 130 of the measurement circuit 197. As shown in FIG. 8, the resistive load 130 includes the resistors 190–193. The resistor 190 is connected in parallel to the series connection of the resistors 191–193. Moreover, resistor 192 is a variable resistor for calibration purposes. The resistive load simulates the resistance of the battery 119 during normal operation.

The resistors 190–193 are thereby configured in a way so that the voltage input to the voltage measurer (i.e., analog to digital (A/D) converter) 194 of the measurement circuit may be taken across a portion of the resistive load 130. This is done in order to scale the high level ramping voltage (less a diode voltage drop) so that it may be measured (i.e., converted to digital form) by the voltage measurer 194. The ramping voltage (less the diode drop) is scaled by a factor of 7.8.

Referring to FIGS. 1a, 1b and 3, after the relay circuit 164 is set (block 316 of FIG. 3) for each ramping cycle, the tester 100 periodically makes and stores measurements of the scaled ramping voltage during each ramping cycle (block 318 of FIG. 3) which are representative and proportional to the high level ramping voltage (less the diode drop). This is accomplished when the control routine 138 generates during each ramping cycle a voltage measurement enable signal and voltage measuring control signals outputted by the CPU 142 to the voltage measurer 194 for controlling the voltage measurer 194 to make and output voltage measurements of the scaled ramping voltage at rate of approximately 1 kHz. These voltage measurements are outputted by the voltage measurer 194 onto the main data bus 144 and received by the CPU 142. The control routine 138 stores throughout each ramping cycle the 24 most current voltage measurements in the data memory 158.

Figure 9A:
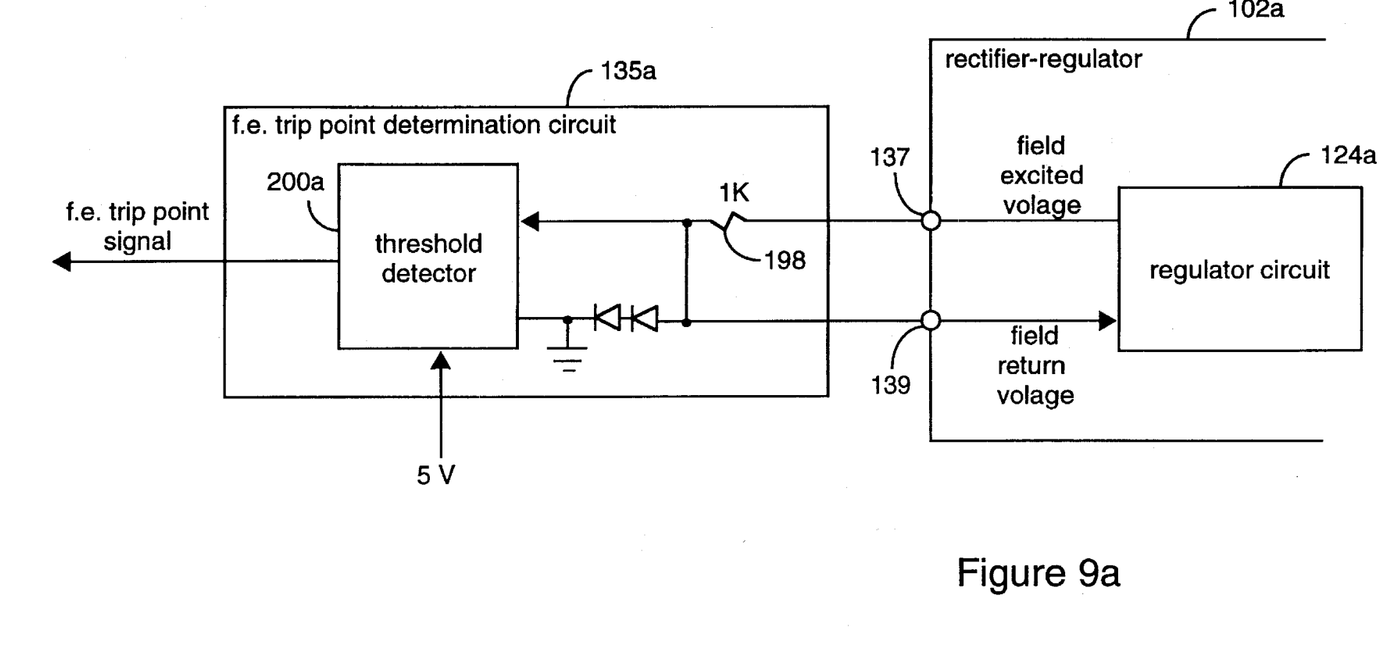

As was suggested earlier, for the rectifier-regulator 102a of FIG. 1a, the field excited trip point determination circuit 135a is connected across the field exciting output terminal 137 and the field return input terminal 139 of the rectifier-regulator 102a. Turning to FIG. 9a, the resistor 198 of the first trip point determination circuit 135a is coupled between the field exciting output terminal 137 and the field return terminal 139 to simulate the field coil 110 of the alternator 104a.

The rectifier circuit 107 provides the high level ramping voltage (less a diode drop) as a field exciting voltage at the field exciting output terminal 137 during each ramping cycle. The trip point determination circuit 135a produces in response during each ramping cycle a field return voltage provided to the field return input terminal 139 of the rectifier circuit 107. The threshold detector 200a is coupled to the field return input terminal 139 and generates a field excited trip point signal during each ramping cycle indicating that the trip point of the rectifier-regulator 102a has occurred when the field return voltage exceeds the predefined and preselected threshold voltage of 1 volt. When this occurs, the current has begun to stop flowing through the resistor 198 that simulates the field coil 110.

Figure 9B:
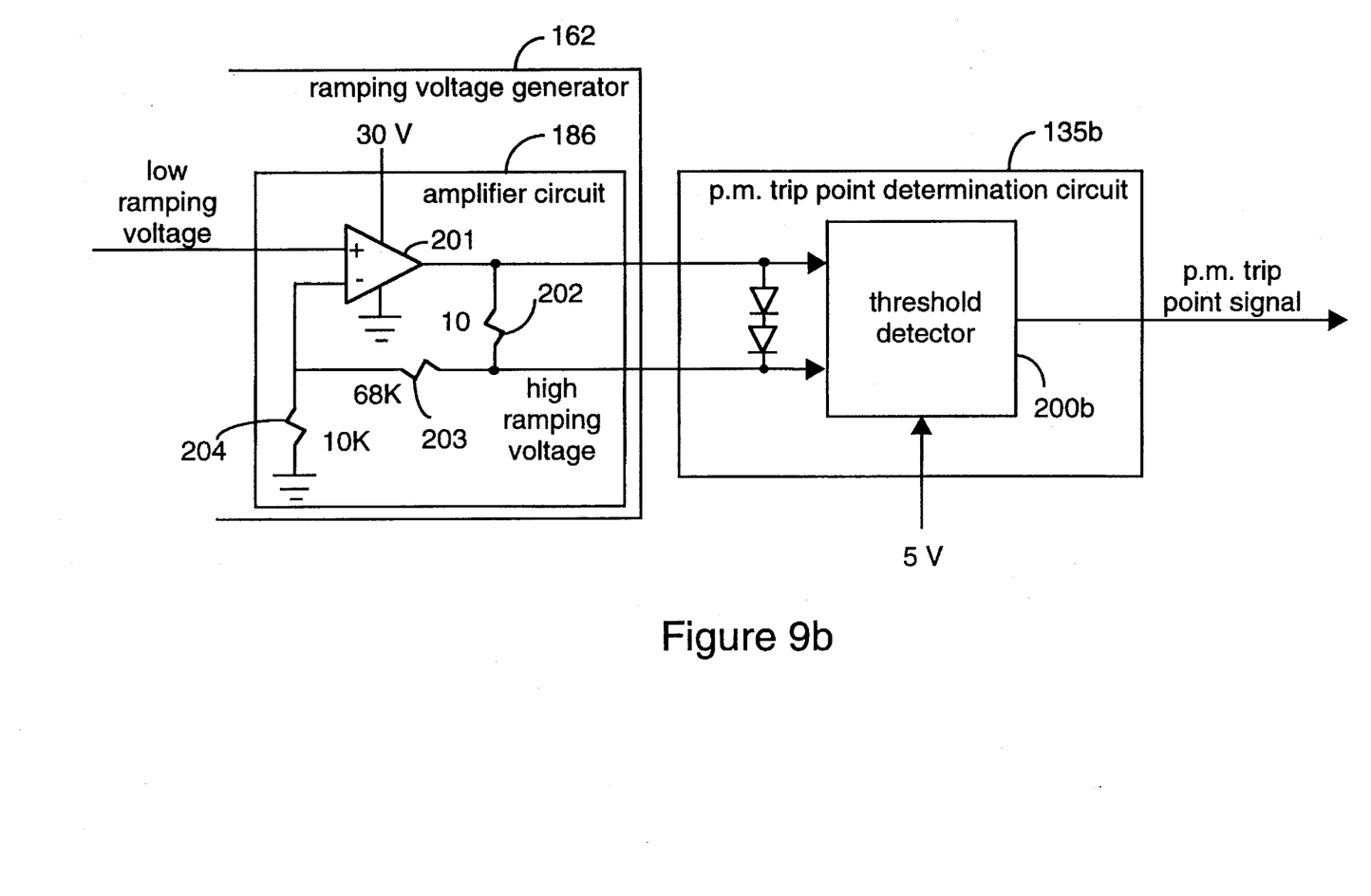
FIG. 9b is a block diagram of the trip point determination circuit used to determine the trip point of the rectifier-regulator of FIG. 2b.

As was indicated earlier for the rectifier-regulator 102b of FIG. 1b, the permanent magnet trip point determination circuit 135b is connected to the ramping voltage generator 162. Referring to FIG. 9b, the threshold detector 200b is coupled across the output resistor 202 of the amplifier circuit 186. It generates a permanent magnet trip point signal during each ramping cycle indicating that the trip point of the rectifier-regulator 102b has occurred when voltage across the resistor 202 exceeds the predefined and preselected threshold voltage of 1 volt. When this occurs, the current through the resistor 202 and the resistive load 130 is approximately 100 mA which indicates that the trip point has been reached and the rectifier-regulator is in the process of shunting the current away from the resistive load 130. The threshold detectors 200a and 200b may be PS2501-2 opto-couplers produced by NEC.

Referring again to FIGS. 1a, 1b, and 3, the trip point signal generated by the trip point determination circuit 135a or 135b is provided to the status latch 162. The control routine 138 then generates control signals outputted by the CPU 142 and decoded by the decoder 145 to produce the status latch enable signal. In response, the status latch 162 latches the status signals, including the trip point signal, onto the main data bus 144. During each ramping cycle, the control routine 138 determines when the trip point signal received by the CPU 142 indicates that the trip point of the rectifier-regulator 102a or 102b has occurred (decision block 322 of FIG. 3).

If a trip point has not occurred, then the control routine 138 checks the ramping status signal to determine if the ramping cycle is still occurring (decision block 324 of FIG. 3). If it is, then the control routine 138 continues to control the making of voltage measurements by the voltage measurer 194 (block 318 of FIG. 3) and continues to store the 24 most current measurements in the data memory 158 (block 320 of FIG. 3). If however, the ramping cycle is completed and no trip point has occurred, then this indicates that the rectifier-regulator 102a or 102b has failed the test for the particular diode combination 116, 117, or 118 that corresponds to the current counter value and the just completed ramping cycle. Then, the control routine 138 generates an LCD enable signal and display data outputted by the CPU 142 and provided to the LCD 136 for displaying the fail result of the corresponding diode combination 116, 117, or 118 (block 326 of FIG. 3).

If a trip point has occurred, then control routine 138 estimates the trip point voltage (block 327 of FIG. 3). This is done by computing the average of the 16 least most current of the 24 most current voltage measurements stored in data memory 158 at the time when control routine 138 determines that a trip point has occurred. The computed average represents the estimated trip point voltage.

Once the trip point voltage has been estimated, control routine 138 determines whether the associated trip point voltage is within the range between the maximum and minimum trip point voltages stored in the data memory 158 (decision block 328). This is done by comparing the estimated trip point voltage with the stored maximum and minimum trip point voltages. If the estimated trip point voltage falls within the range defined by the stored maximum and minimum trip point voltages, then this indicates that the rectifier-regulator 102a or 102b has passed the test for the diode combination 116, 117, or 118 that corresponds to the current counter value and the just completed ramping cycle. Then, the control routine 138 generates an LCD enable signal and display data outputted by the CPU 142 and provided to the LCD 136 for displaying the pass result for the corresponding diode combination 116, 117, or 118 (block 330 of FIG. 3).

Once the pass or fail result has been displayed, then control routine 138 increments the counter value (block 332) and determines if this value exceeds 3 (i.e., the total number of the diode combinations 116–118) (decision block 334). If it does not, then the 30 volt power supply circuit 168 is turned off (block 312 of FIG. 3) and the process described above (blocks 308–334 of FIG. 3) is repeated for the next ramping cycle. If the values does exceed 3, then the test is completed and the LCD 136 displays the earlier described pass/fail information and the fact that the test has been completed (block 336 of FIG. 3). This is done when the control routine 138 generates an LCD enable signal and display data outputted by the CPU 142 and provided to the LCD 136 for displaying the pass/fail results together with the test completion information (block 326 of FIG. 3).

While the present invention has been described with reference to a few specific embodiments, the description is illustrative of the invention and is not to be construed as limiting the invention. For example, although the tester 100 has been described for testing the rectifier-regulator 102a or 102b of a motorcycle, those skilled in the art will appreciate that it may be used as well for the rectifier-regulator of any motor vehicle. Furthermore, various other modifications may occur to those skilled in the art without departing from the true spirit and scope of the invention as defined by the appended claims.

What is claimed is:

1. A tester for testing a rectifier-regulator, said rectifier-regulator including a multiplicity of input terminals for each receiving an input voltage from an alternator and an output terminal for providing in response an output current at an output voltage to a battery, said rectifier-regulator having a trip point at which said output current is regulated by said rectifier-regulator and at which said output voltage is a trip point output voltage, said tester comprising;

a ramping voltage generator configured to generate a ramping input voltage during each of a multiplicity of ramping cycles in response to a ramping control signal for each ramping cycle;

a relay circuit configured to relay said ramping input voltage to one of said input terminals during each ramping cycle in response to relay control signals for each ramping cycle, said rectifier-regulator providing in response a ramping output voltage at said output terminal during each of said ramping cycles;

a trip point determination circuit configured to (A) determine when said trip point occurs during each of said ramping cycles and (B) generate in response a trip point signal during each of said ramping cycles indicating that said trip point has occurred;

a voltage measurement circuit configured to make voltage measurements during each of said ramping cycles representing said ramping output voltage;

a memory configured to store a predefined maximum trip point voltage and a predefined minimum trip point voltage;

a controller configured to (A) generate said ramping control signals, (B) generate said relay control signals, (C) estimate said trip point output voltage for each ramping cycle in response to said trip point signal and said voltage measurements, (D) compare said estimated trip point voltage for each of said ramping cycles with said stored predefined maximum and minimum voltages, and (E) generate a trip point error flag indicating a trip point error for each of said ramping cycles for which said compared trip point voltage does not fall within a range between said stored predefined maximum and minimum voltages.

2. A tester as recited in claim 1 wherein said voltage measurement circuit includes:

a resistive load responsive during each ramping cycle to said ramping output voltage;

a voltage measurer for making said voltage measurements across at least a portion of said resistive load during each of said ramping cycles.

3. A tester as recited in claim 1 wherein said controller is further configured to (A) store in said memory during each of said ramping cycles currently made ones of said voltage measurements, and (B) estimate said trip point voltage during each of said ramping cycles based on said stored currently made ones of said voltage measurements.

4. A tester as recited in claim 3 wherein said controller is further configured to compute said trip point voltage by averaging said stored currently made ones of said voltage measurements.

5. A tester as recited in claim 1 further comprising:

selection means for enabling a user to select said predefined maximum and minimum trip point voltages;

said controller further configured to store said selected maximum and minimum trip point voltages in said memory.

6. A tester as recited in claim 5 wherein said selection means includes:

a first dip switch configured to enable a user to select said predefined maximum trip point voltage;

a second dip switch configured to enable a user to select said predefined minimum trip point voltage;

a first latch coupled to said first dip switch for receiving and latching said selected maximum trip point voltage; and a second latch coupled to said second dip switch for receiving and latching said selected minimum trip point voltage;

said controller coupled to said first and second latches and configured to store said latched maximum and minimum trip point voltages in said memory.

7. A tester as recited in claim 1 wherein:

said recitifier-regulator includes a field exciting output terminal and a field return input terminal;

said rectifier-regulator providing at said field exciting output terminal during each ramping cycle said output ramping voltage as a field exciting voltage in response to said input ramping voltage; and said trip point determination circuit includes:

a resistor responsive to said field exciting output voltage during each ramping cycle for providing a field return voltage to said field return terminal during each ramping cycle; and threshold detection circuitry configured to during each ramping cycle (A) detect when said field return voltage exceeds a predefined threshold voltage and (B) generate in response said trip point signal.

8. A tester as recited in claim 1 wherein:

said ramping voltage generator includes:

a ramping circuit responsive to said ramping control signals for generating a low level ramping voltage during each of said ramping cycles;

an amplifier circuit configured to during each ramping cycle amplify said low level ramping voltage to produce a high level ramping voltage, said amplifier circuit including:

an amplifier having a first input for receiving said low level ramping voltage during each ramping cycle, a second input, and an output;

an output resistor coupled between said output of said amplifier and said relay circuit for providing said relay circuit with said high level ramping voltage during each ramping cycle;

a feedback resistor coupled between said output resistor and said second input;

said trip point determination circuit includes threshold detection circuitry coupled across said output resistor and configured to during each ramping cycle (A) detect when a voltage across said output resistor exceeds a predefined threshold voltage during each ramping cycle and (B) generate in response said trip point signal.

9. A method of testing a rectifier-regulator, said rectifier-regulator including a multiplicity of input terminals for each receiving an input voltage from an alternator and an output terminal for providing in response an output current at an output voltage to a battery, said rectifier-regulator having a trip point at which said output current is regulated by said rectifier-regulator and at which said output voltage is a trip point output voltage, said method comprising the steps of;

generating a ramping voltage control signal for each of a multiplicity of ramping cycles;

generating a ramping input voltage during each of said ramping cycles in response to said ramping voltage control signals;

generating relay control signals for each of said ramping cycles;

relaying said ramping input voltage to one of said input terminals during each ramping cycle in response to said relay control signals, said rectifier-regulator providing in response a ramping output voltage at said output terminal during each of said ramping cycles;

determining when said trip point occurs during each of said ramping cycles and generating in response a trip point signal during each of said ramping cycles indicating that said trip point has occurred;

making voltage measurements during each of said ramping cycles representing said ramping output voltage;

estimating said trip point output voltage for each ramping cycle in response to said trip point signal and said voltage measurements;

storing a predefined maximum trip point voltage and a predefined minimum trip point voltage;

comparing said estimated trip point voltage for each of said ramping cycles with said stored predefined maximum and minimum voltages; and generating a trip point error flag indicating a trip point error for each of said ramping cycles for which said compared trip point voltage does not fall within a range between said stored predefined maximum and minimum voltages.

10. A method as recited in claim 9 wherein said step of making said voltage measurements includes the steps of:

utilizing a resistive load responsive during each ramping cycle to said ramping output voltage;

making said voltage measurements across at least a portion of said resistive load during each of said ramping cycles.

11. A method as recited in claim 10 wherein said estimating step includes the steps of:

storing during each of said ramping cycles currently made ones of said voltage measurements; and determining said trip point voltage during each of said ramping cycles based on said stored currently made ones of said voltage measurements.

12. A method as recited in claim 11 wherein said step of determining said trip point voltage includes the step of computing said trip point voltage by averaging said stored currently made ones of said voltage measurements.

* * * * *